United States Patent [19]
Bieg

[11] Patent Number: 5,901,936
[45] Date of Patent: May 11, 1999

[54] SIX-DEGREE-OF-FREEDOM MULTI-AXES POSITIONING APPARATUS

[75] Inventor: Lothar F. X. Bieg, Albuquerque, N.M.

[73] Assignee: Sandia Corporation, Albuquerque, N.M.

[21] Appl. No.: 08/918,029

[22] Filed: Aug. 25, 1997

[51] Int. Cl.[6] .................................................. A47G 29/00
[52] U.S. Cl. ......................... 248/370; 248/163.2; 434/58
[58] Field of Search ............................... 248/370, 124.1, 248/131, 130, 138, 395, 398, 163.2, 278.1, 163.1; 434/58; 364/512

[56] References Cited

U.S. PATENT DOCUMENTS

| | | | |
|---|---|---|---|
| 3,419,238 | 12/1968 | Flory | 248/163.1 |
| 4,988,244 | 1/1991 | Sheldon et al. | 409/132 |
| 5,028,180 | 7/1991 | Sheldon et al. | 409/201 |
| 5,109,951 | 5/1992 | Lecore | 248/124.1 X |
| 5,179,525 | 1/1993 | Griffis et al. | 364/512 |
| 5,263,382 | 11/1993 | Brooks et al. | 74/471 XY |
| 5,355,743 | 10/1994 | Tesar | 74/479 BP |
| 5,401,128 | 3/1995 | Lindem et al. | 409/132 |
| 5,485,763 | 1/1996 | Pincus | 248/370 X |
| 5,545,040 | 8/1996 | Lu | 434/58 |

*Primary Examiner*—Ramon O. Ramirez
*Attorney, Agent, or Firm*—George H. Libman

[57] ABSTRACT

A six-degree-of-freedom multi-axes positioning apparatus is comprised of a geometry of six independent angle connectors. Each angle connector connects two fixed length rods to a pivot on one of two opposing platforms. The combination of an angle connector, at least two pivots and at least two rods having free ends connected to the pivots comprises a leg assembly. The spatial location of the upper platform is changed in relation to the lower platform by angular changes within each angle connector. This angular change results in degrees of motion within the apparatus defined as X, Y, Z, Tip, Tilt, and Rotation, or a combination of the above. This invention is known as a ROTOPOD.

18 Claims, 6 Drawing Sheets

Optimized Design
Volume = 10.16

Standard Design
Volume = 2.89

SIX-DEGREE-OF-FREEDOM MULTI-AXES POSITIONING APPARATUS

GOVERNMENT RIGHTS

This invention was made with United States Government support under Contract No. DE-AC04-94AL85000 awarded by the U.S. Department of Energy. The Government has certain rights in this invention.

RELATED APPLICATIONS

None.

FIELD OF THE INVENTION

The present invention relates generally to the field of multi-axes positioning devices. More specifically, the present invention relates to systems with the capability of performing six-degrees of motion in space.

Automatic cutting machines and machine tools utilized in industrial manufacturing operations generally rely upon electromechanical systems to accomplish movement with more than one range of motion. As industrial manufacturing and scientific research increasingly rely upon sophisticated machining and robotic devices, a need has developed for positioning mechanisms which move with more than one range of motion without limiting structure and efficiency.

Devices known as HEXAPODS have been demonstrated for a number of years in an attempt to solve problems associated with conventional machine tools and robots, particularly orthogonal machines employing a number of linear slides mounted on top of each other. Some HEXAPODS allow for micro-positioning within six-degrees-of-freedom. Sophisticated software and electronics allow the user to address any point in space within the working volume of a HEXAPOD.

A robot is based on a series of chain structures, whereas a HEXAPOD is based on a Stewart platform, a six-degree-of-freedom externally constrained mechanism that possesses a parallel actuation geometry rather than a series or robot-like geometry. A typical Stewart platform has five axes of motion and an additional sixth axis in the sense that the entire platform can be rotated up to 30 degrees coaxially about its vertical centerline. A typical HEXAPOD includes three sets of linear telescoping strut pairs joined to a platform. The vibration and load-carrying capabilities of a Stewart platform and thus of a HEXAPOD are superior to those of comparable series structures. The position and attitude of the platform depends on the length of the six linear struts.

One such apparatus is described in U.S. Pat. Nos. 5,028,180 and 4,988,244 of Paul Sheldon et al. These patents discloses a six-axis machine including a pair of spaced supports joined by six powered and extensible legs jointed to the respective platforms by universal joints. The length of each leg is individually adjusted to vary the position of the platforms relative to each other.

SUMMARY OF THE INVENTION

It is an object of this invention to overcome limitations of HEXAPODS and other prior art positioning mechanisms by providing a simplified design that does not rely upon linear servostruts and is thus free to operate in a true six degree of motion environment, as well as over a larger range of motion.

It is another object of this invention to provide a positioning mechanism utilizing jointed fixed length legs Additional objects, advantages, and novel features of the invention will become apparent to those skilled in the art upon examination of the following description or may be learned by practice of the invention. The objects and advantages of the invention may be realized and attained as particularly pointed out in the appended claims.

To achieve the foregoing and other objects, and in accordance with the purpose of the present invention, as embodied and broadly described herein, the present invention may comprise a multi-axes positioning apparatus having opposed upper and lower platforms and six independent leg assemblies extending between said platforms. Each leg assembly has a fixed-length upper rod having one end moveably connected to the upper platform and a fixed-length lower rod having one end being moveably connected to the lower platform. An angle connector connects the other end of the upper rod to the other end of the lower rod while permitting the upper rod to move with respect to said lower rod with only one degree of freedom.

BRIEF DESCRIPTION OF THE DRAWINGS

FIG. 5 shows a connection of an upper rod to a platform according to the second embodiment.

DETAILED DESCRIPTION OF THE INVENTION

Figure 1:
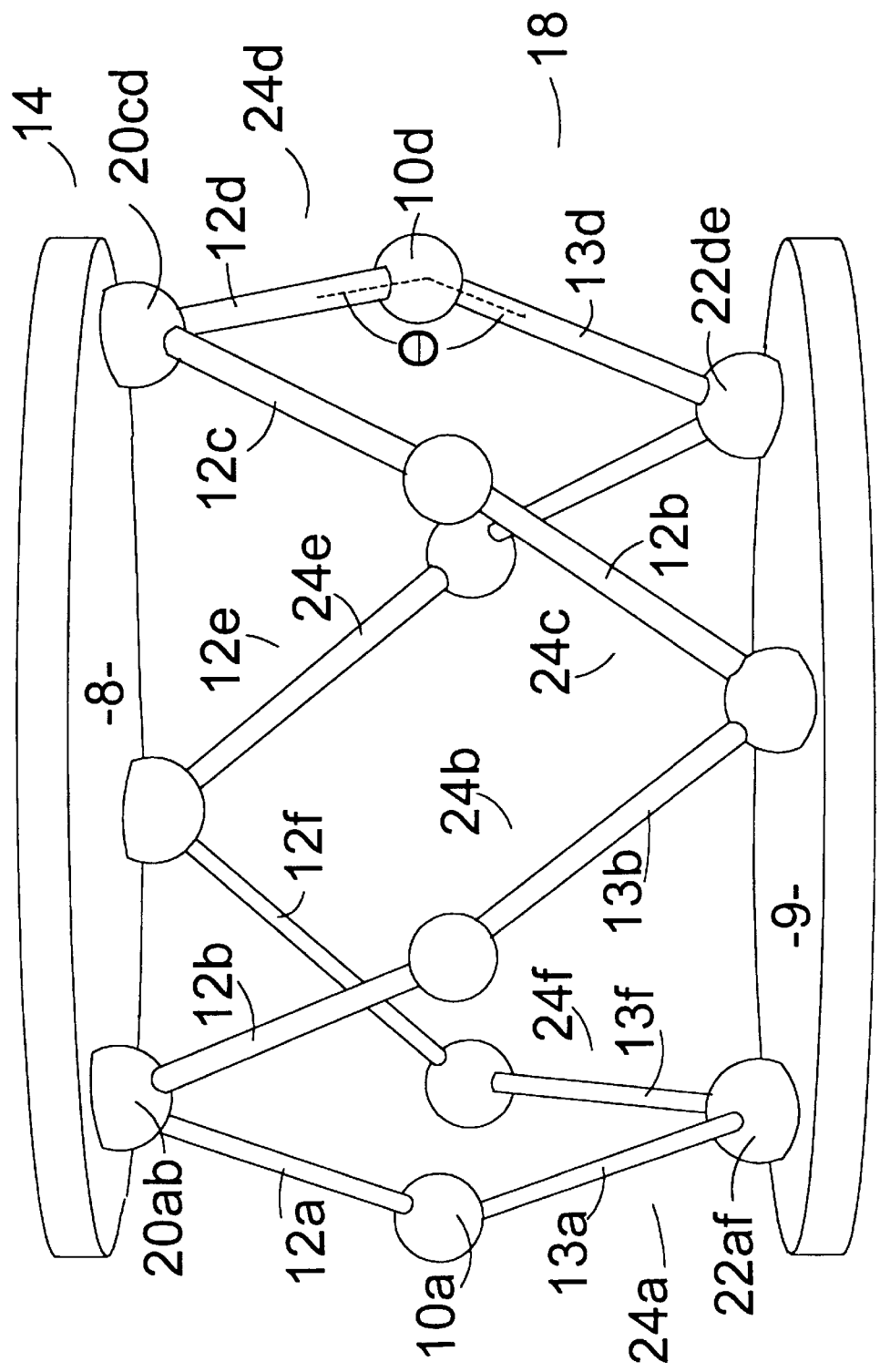
FIG. 1 is a perspective view of a first embodiment of the invention.

FIG. 1 shows a first embodiment of a ROTOPOD, a six-degree-of-freedom multi-axes positioning apparatus 18 which includes a lower platform 16 and an opposed upper platform 14 that is fastened and moveable with respect to lower platform 16 by six leg assemblies 24a to 24f. As used herein, a designation of an individual leg assembly or component thereof will include the letter a–f; a designation of all leg assemblies or identical components thereof will have only an identifying number.

As shown in FIG. 1, each leg assembly 24 includes an angle connector 10 for controlling the movement between a fixed length upper rod 12, extending generally in an "up" direction from angle connector 10, and a fixed length lower rod 13, extending generally in a "down" direction from angle connector 10. Each angle connector 10 functions as a common hinge and has only a single axis of rotation which permits its connected upper rod 12 and lower rod 13 to rotate through an angle θ only in a plane perpendicular to the angle of rotation, as discussed hereinafter. Preferably, all upper rods 12 are of an equal length and all lower rods 13 are of an equal length. It is not necessary, and it may be preferable, if the length of rod 12 is not the same as the length of rod 13.

Each upper rod 12 extends to a pivot 20 on lower surface 8 of upper platform 14, and each lower rod 13 extends to a pivot 22 on upper surface 9 of lower platform 16. As further shown in FIG. 1, pairs of rods are adjacent at three nodes at each platform; the nodes being spaced over each surface in a triangular arrangement. In the preferred embodiment, the three nodes form an equilateral triangle of pivots 20 and 22 on each of surfaces 8 and 9, respectively, where upper rods 12a and 12b meet at pivot 20ab; upper rods 12c and 12d meet at pivot 20cd; and upper rods 12e and 12f meet at pivot 20ef.

To provide stability to the assembly 18, the lower rods 13 are paired to their respective nodes on surface 9 where rods 13a and 13f meet at pivot 22af, rods 13b and 13c meet at a second pivot 22bc, and rods 13d and 13e meet at the third pivot 22de.

The position of upper platform 14 with respect to lower platform 16 is changed by adjusting the angle θ between the upper and rods of each leg. When all rods 12 and 13 are of equal length, a "home position" of the apparatus 18 exists with the two surfaces parallel to each other when angle θ for each angle connector 10 is 60°. To change the distance between platforms along the Z-axis, the angle θ is identically changed for all angle connectors 10. For example, if angle θ increases, upper platform 14 moves away from lower platform 16 while maintaining the parallel relationship. Different changes to angle θ for each of drives 10a–e cause upper platform 14 to achieve an X-axis, Y-axis, tip, tilt and rotational displacement, or a combination of all of the above, with respect to lower platform 16.

Figure 2:
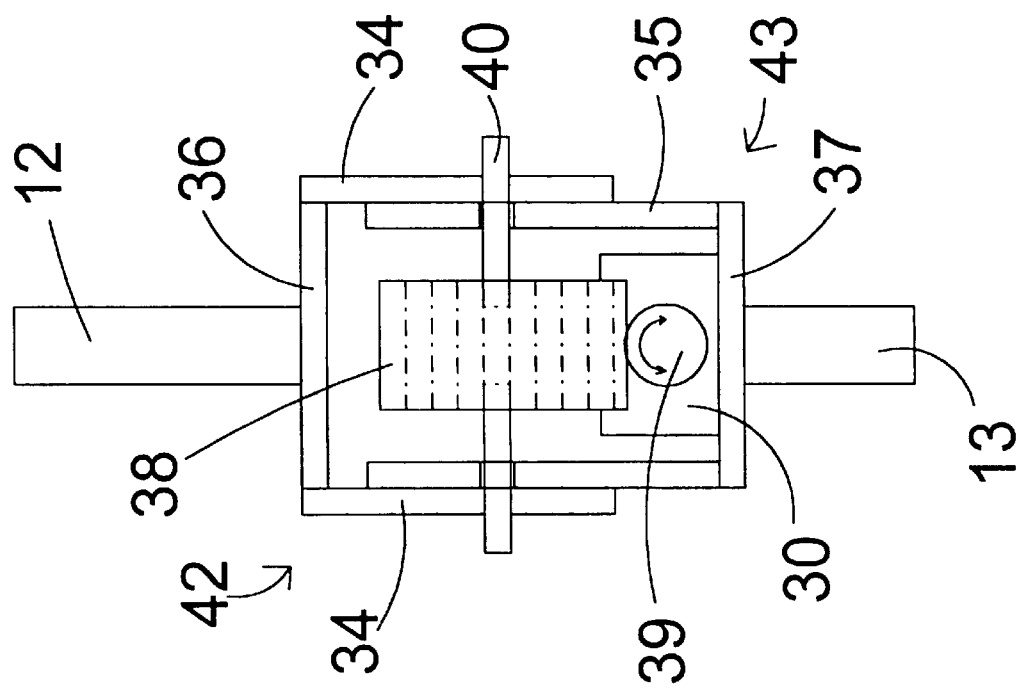
FIGS. 2 shows an angle connector of the embodiment of FIG. 1

As shown in FIGS. 2, each angle connector 10 includes a first U-shaped bracket 42 having opposed first portions 34 affixed to an axle 40. Bracket 42 further includes a second portion 36 fixed perpendicular to and between first portions 34. One end of either rod (upper rod 12 is illustrated) is rigidly fixed to portion 36. A second U-shaped bracket 43 has opposed first portions 35 having a hole through which axle 40 extends and rotates. Bracket 43 further includes a second portion 37 extending perpendicular to and between portions 35. One end of the other rod (lower rod 13 is illustrated) is rigidly fixed to portion 35.

Rotation of bracket 48 with respect to bracket 43 about axle 40 causes angle θ between rods 12 and 13 to change. The movement of each rod is constrained within a plane perpendicular to axle 40. Preferably, both rods move within the same plane.

The aforementioned rotation is controlled by an electric drive motor 30 rigidly fastened to bracket 37. Drive motor 30 includes a rotating drive shaft having a worm gear 39 which meshes with the outer teeth of gear 38. The axis of gear 38 is rigidly fastened to axle 40, whereby rotation of drive shaft 31 causes gear 38 to turn axle 40, bracket 42, and rod 12 with respect to bracket 43 and rod 13. Drive motor 30 may also include a shaft encoder (not shown) to enable a control system to accurately determine the number of turns made by the drive shaft, in order that the position of the rods may be determined.

The highest displacement accuracy of the upper platform 14 is achieved at the largest angle possible (i.e. 180 degrees). Each independent leg assembly 24 can be fully extended to such a position. The largest possible angle of all leg assemblies 24 also coincides with the maximum displacement between the upper platform 14 and the lower platform 16 in the Z-axis direction. At this angle, the vertical load bearing capability and stiffness of the apparatus 18 will be at a maximum. Thus, the maximum range of motion of apparatus 18 is the distance from a fully extended independent leg assembly 24 to a location where the upper platform 14 almost touches the lower platform 16, creating maximum Z-axis displacement.

Figure 3:
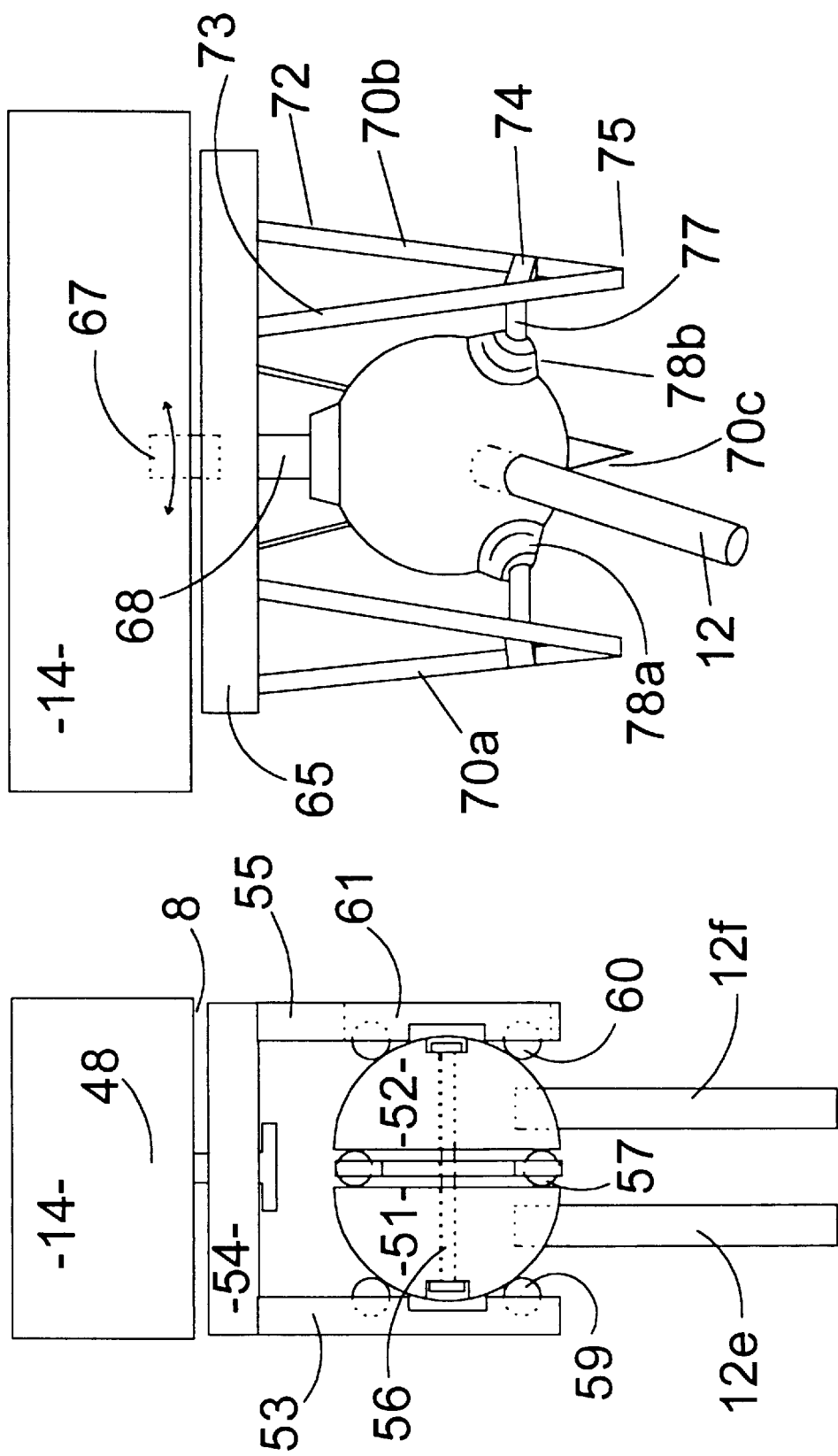
FIG. 3 shows a connection of two rods to a platform according to the first embodiment.

One embodiment of the connection a pair of legs to surface 8 of upper platform 14 is shown as pivot 20ef in FIG. 3. A U-shaped bracket consisting of a base 54 and spaced arms 53 and 55 pivots around a pin 48 which extends into lower surface 8. The upper end of rod 12e is fastened to a hemisphere 51, and the upper end of rod 12f is fastened to a similar hemisphere 52. These hemispheres are butted together with a conventional thrust bearing formed by a plurality of rollers 57 held by an annular ring 58. A pin 56 holds hemispheres 51 and 52 together and permits each hemisphere to rotate around pin 56 with respect to the other hemisphere. The entire assembly rotates freely between the arms 53 and 55 on spaced roller bearings 59, 60. For ease in assembly and adjustment, bearings 60 are preferably held by a threaded cylinder 61 that is inserted in a corresponding hole in arm 55.

The lower rods 13 are fastened to upper surface 9 of lower platform 16 by pivots 22. Which pivots may be identical to pivots 20.

The embodiment of FIG. 3 permits each rod 12 to move in any angular direction with respect to platform 14; however, the movement of any two rods at a pivot is constrained to parallel planes that are perpendicular to axle 56. Overall, each leg has at least 6 degrees of freedom of motion, with only one at angle connector 10 and no more than two degrees of freedom at one of the connections to either platform. In the embodiment of FIG. 1, pivots 22 have two degrees of freedom of motion and pivots 20 have more than two.

Although the leg portions are referred to as rods, it should be understood that rod as used in this invention means any rigid, elongated element of fixed length. It may be preferable to use a hollow cylinder for the lower rods, as electrical wires could be carried within such a structure.

The advantages of this structure include the ability to position the platform very accurately; a requirement for machining and other applications. Although it has proven difficult to make extensible legs of the type used in the Sheldon patents having high positional accuracy, the fixed length of the legs of the invention permit precise repeatability in positioning.

Figure 4:
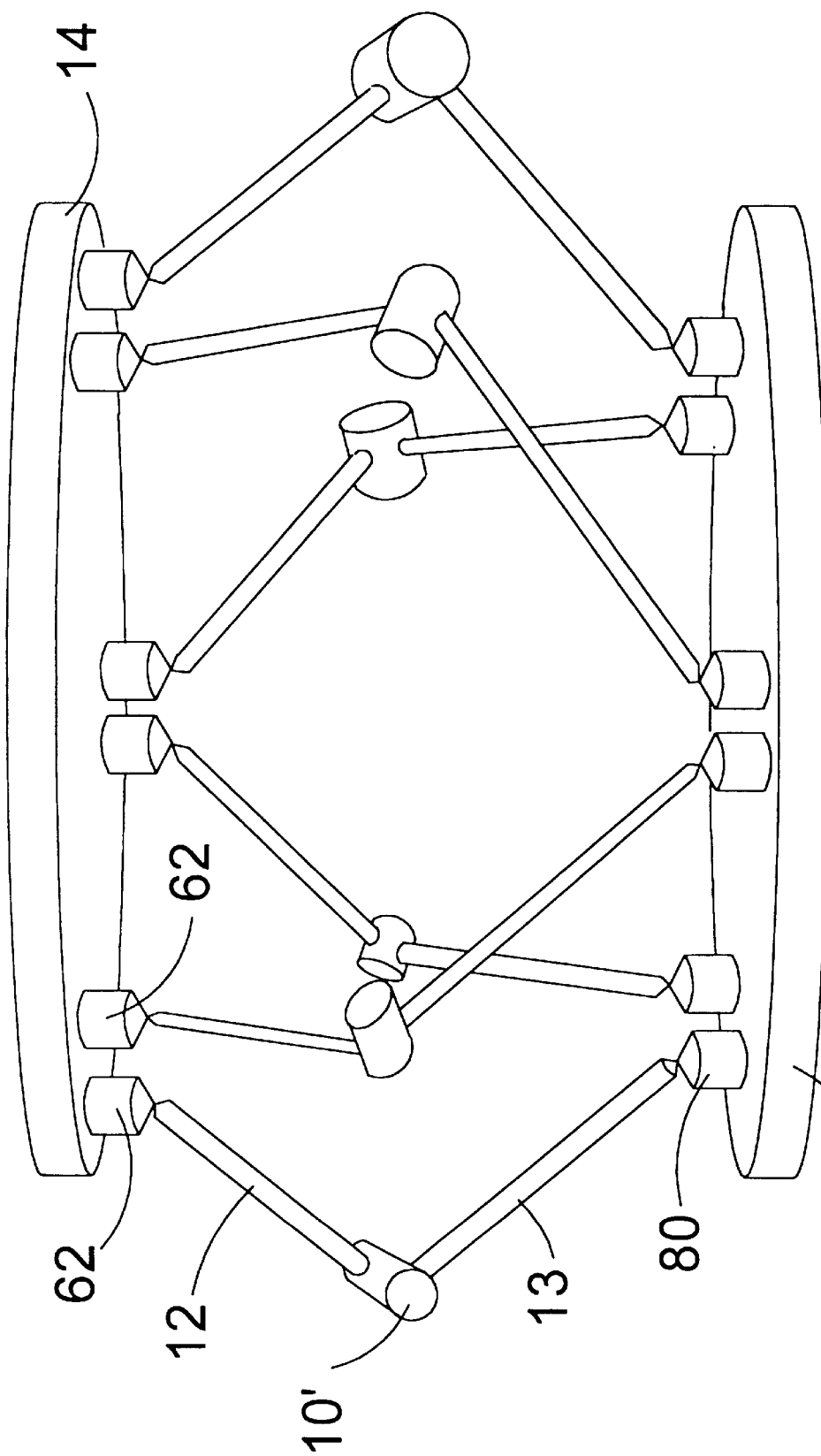
FIG. 4 shows a second embodiment of the invention.

FIG. 4 shows a second embodiment of the invention where the drive motor for each leg assembly is on the lower platform 16. In this embodiment, each upper rod 12 is individually mounted to upper platform 14 through an individual pivot 62. Each pivot 62 may be a conventional ball and socket arrangement to enable rod 12 to three degrees of freedom of motion, tilt, tip, and roll, with respect to platform 14. Alternatively, each pivot 62 may be a conventional universal joint pivotally connected to platform 14. Upper and lower rods 12, 13 are connected together through a angle connector 10' which may be identical to angle connector 10 except for the absence of a drive motor. As in the first embodiment, angle connector 10' permits movement on rod 12 with respect to rod 13 with one degree of freedom. A shaft encoder may still be incorporated into angle connector 10' to provide an indication of the relative position of one rod with respect to the other rod. Each lower rod 13 is individually mounted to platform 16 through a universal joint drive 80 as discussed hereinafter which permits rod 13 to pitch and tilt, but not roll, with respect to platform 16.

Pivot 62, an improved ball and socket assembly, is shown in FIG. 5 to include a base 65 which is rotatably mounted to surface 14 by a perpendicular axle 67. A leg 12 is rigidly attached to a sphere 76, which is held to pivot 62 by sliding contacts 78a, 78b, 78c (hidden) spaced around the surface of sphere 76 below its circumference, and contact 69 adjacent base 65. Each of contacts 78a–78c is held by an associated "A-shaped" support 70a–70c. Each support 70 consists of a pair of legs 72, 73 that meet at apex 75 and support a brace 74 to which contact 78 is attached by an arm 77. Contact 69 is held by a support 68.

In operation, leg 12 may rotate in any direction with respect to pivot 62. Should leg 13 move adjacent a contact 78, it will hit apex 75, causing base 65 to rotate. This construction provides much greater range of motion than a conventional ball and socket.

Figure 6:
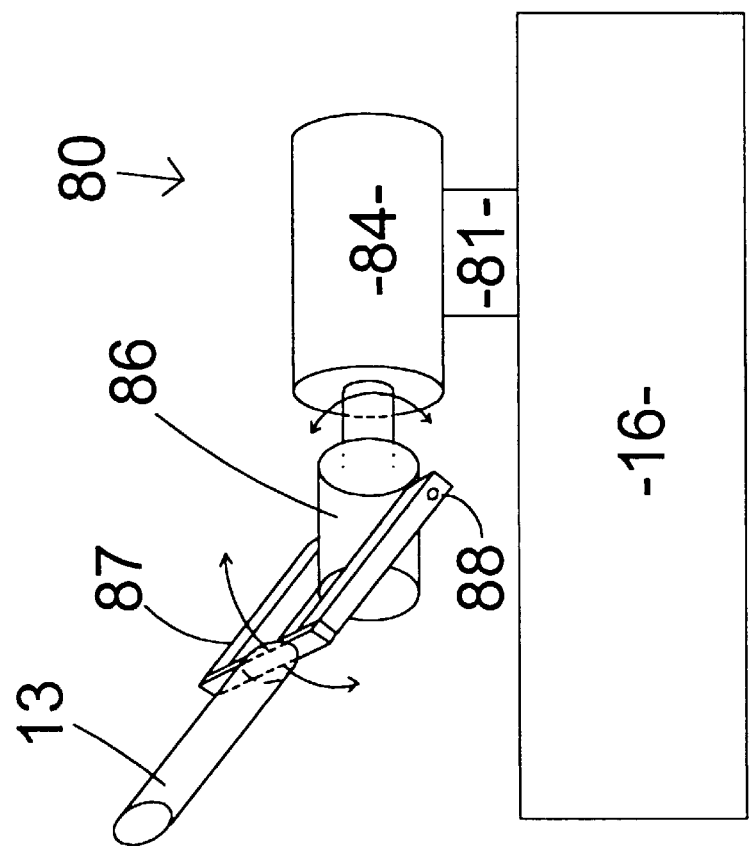
FIG. 6 shows a connection of a low rod to a platform according to the second embodiment.

FIG. 6 shows one of six universal drives 80 that connect each lower rod to platform 16 and drive the structure of the embodiment of FIG. 5. Each drive 80 includes a motor 84 mounted adjacent upper surface 9 by support 81. The output of motor 84 is a rotating shaft 85 that is preferably internally geared within motor 84 for very precise motion in either direction. A cylinder 86 is axially aligned with and affixed to the end of shaft 85. A clevis 87 is attached to cylinder 86 for rotational movement about an axis 88 extending through cylinder 86 perpendicular to the axis of rotation of shaft 85. Lower leg 13 is affixed to clevis 87 to form a U-joint connection between leg 13 and cylinder 86. Each pair of devices, such as 80c and 80e, is adjacent each other with shafts 85c, 85e pointing in opposite directions generally parallel to the circumference of platform 16.

Although the above-described arrangement of adjoining drives 80 is believed optimum, other arrangements are also contemplated within the scope of the invention. For example, a shaft 85 could be aligned with a radius extending from the center of platform 16 to its circumference. In addition, some drives 80 could be located nearer to the center of platform 16 than other drives 80, and a pair of drives, such as 80c and 80e, could be placed in a side-by-side arrangement.

To understand the operation of the universal drives 80, consider drive 80b. If shaft 85 is turned to an initial position such that clevis 87 is perpendicular to platform 16, lower rod 13b is constrained to a plane parallel to platform 16, minimizing the possible separation between platforms 14 and 16. As clevis 87 is rotated by shaft 85 to an acute angular position with respect to platform 16, as shown in FIG. 6, rod 13b is raised, adjusting the position of platform 14. The maximum range of motion of each clevis 87 is 180° from the initial position.

The position of the platform of each embodiment may be determined from measuring the angle between the rods at each angle connector 10 or 10'. Each unique set of angles corresponds to a unique position of platform 14 relative to platform 16. A computer control of a type known to those skilled in the art may be utilized to control the operation of each motor 84 to position platform 14 in any desired manner.

It is as desired goal of any multi-axis apparatus such as the invention or the many other devices known in the art to have as great an operational workspace (volume) as possible. To determine the effect of varying the dimensions of a ROTOPOD on volume, a closed-form inverse kinematic solution was developed and utilized to study and optimize workspace. For these simulations, the radius of upper platform 14 is Rp, the radius of lower platform (or base) 16 is Rb, the length of lower rod 13 is L1; and the length of upper rod 12 is L2. The distance between adjacent legs (such as 80a and 80b in FIG. 4) is represented by the angle α extending from a leg to the center of a platform and to the adjoining leg. Furthermore, all units were standardized such that L1+L2=2. A stick representation of a simulated ROTOPOD is shown in FIG. 7.

Figure 7:
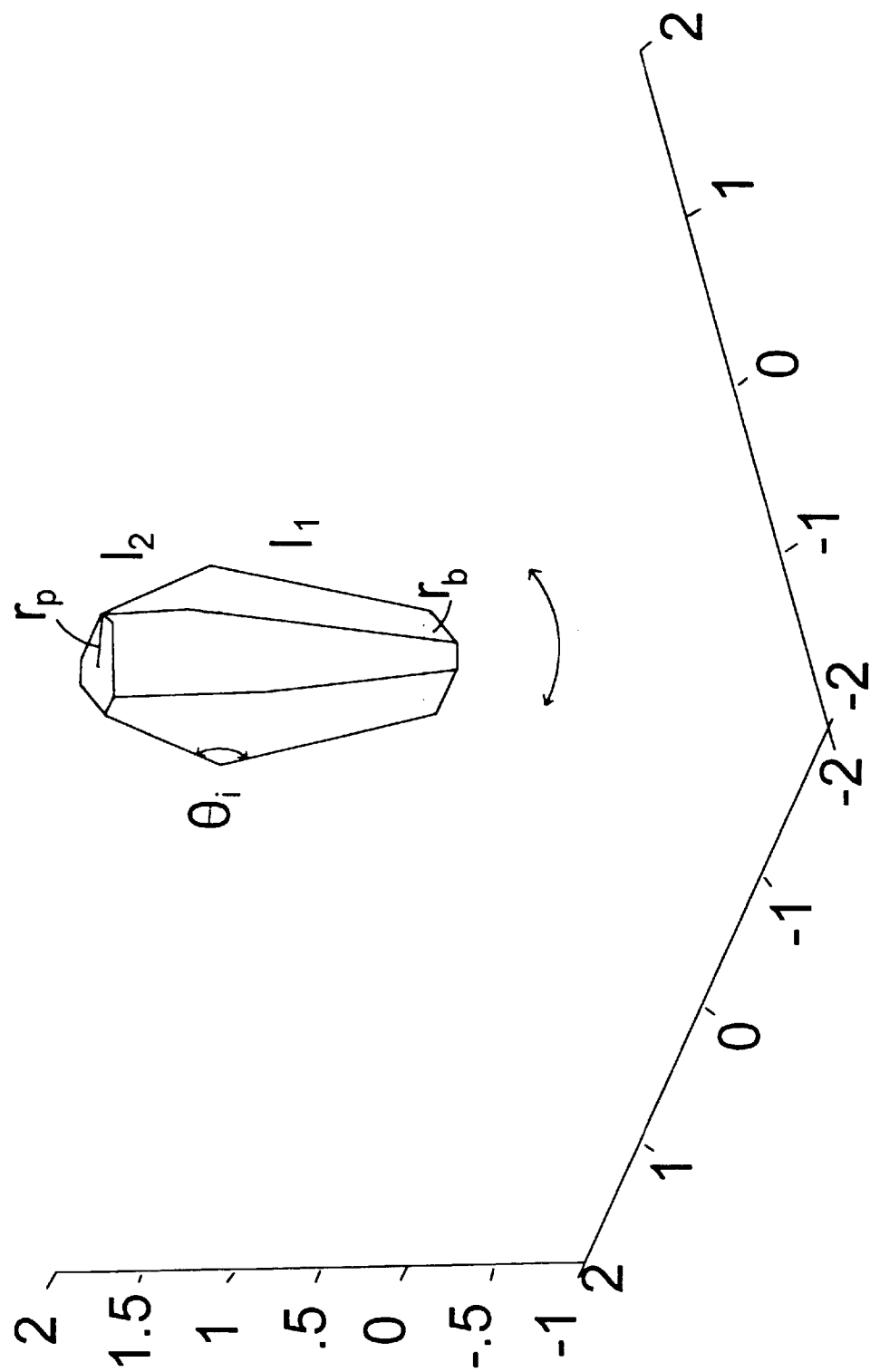
FIG. 7 shows a stick representation used for simulating maximum workspace covered by different embodiments of the invention.

Table I shows data generated from a series of simulations of the device of FIG. 7. For each simulation, the maximum value of: $\theta_r$=150°. Furthermore, these simulations do not account for loss of volume that may occur because of collision between ROTOPOD leg assemblies.

| α | Rb | Rp | L1 | L2 | Volume |
|---|---|---|---|---|---|
| 10 | .50 | .50 | 1.265 | .735 | 5.672 |
| 20 | .50 | .50 | 1.277 | .723 | 6.191 |
| 30 | .50 | .50 | 1.276 | .724 | 6.670 |
| 10 | .25 | .25 | 1.260 | .740 | 6.972 |
| 20 | .25 | .25 | 1.261 | .739 | 7.389 |
| 30 | .25 | .25 | 1.283 | .717 | 7.857 |

These results suggest that workspace is maximized by minimizing platform size and by increasing the angle between adjacent legs. However, it is also believed that as α increases, the ability to rotate platform 12 with respect to platform 14 (about a z axis perpendicular to platform 14) decreases.

Figure 8B:
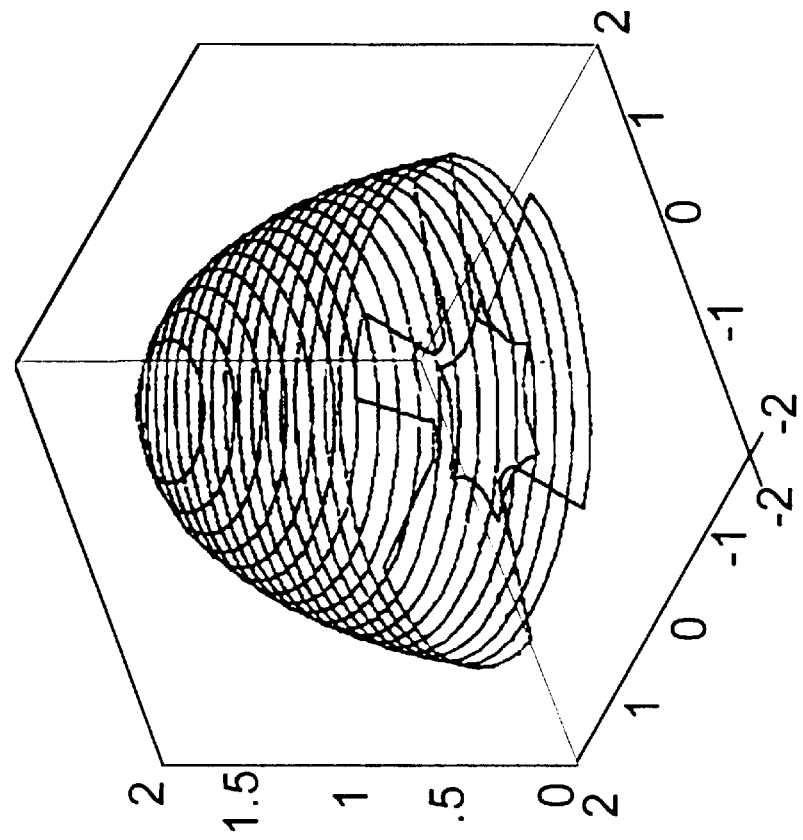
FIGS. 8a and 8b show the simulated workspace for two embodiments of FIG. 7.
Figure 8A:
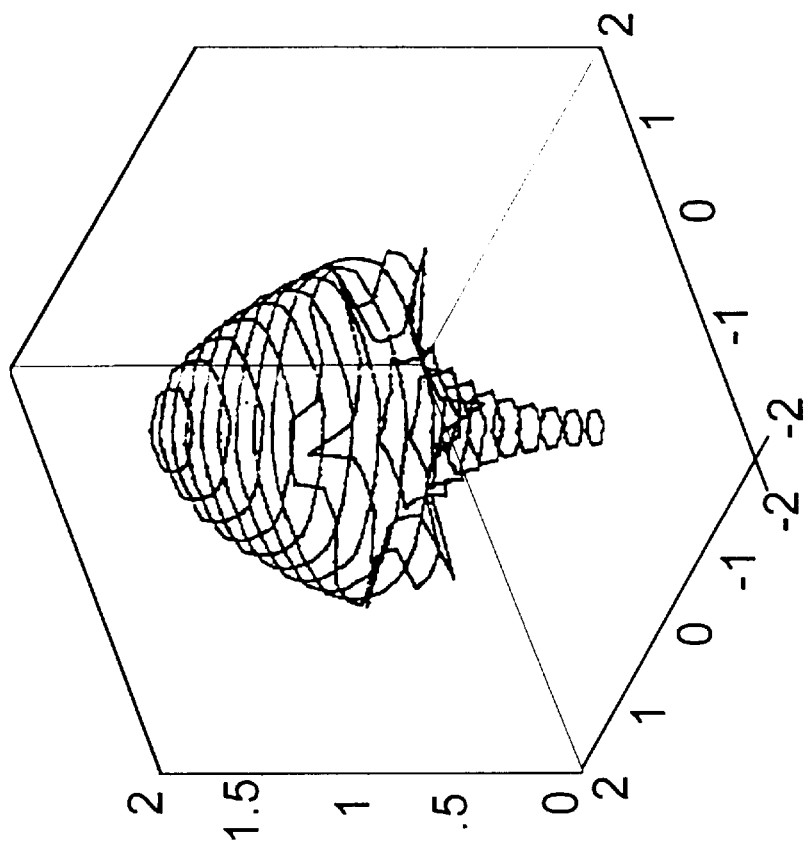

The theoretical workspace for a design with equal length legs, L1=L2=1 that are spaced equally about the platform (α=60°), Rb=1 and Rp=0.5 is shown in FIG. 8a to be less than ⅓ the workspace of an optimized design of FIG. 8b having L1=1.2, L2=0.8; Rb=0.44; Rp=0.47 and α almost 60°.

The ROTOPOD is scaleable over a wide range of sizes. For example, in machine tool applications, a ROTOPOD can be many feet tall. In a micro manipulator application, on the other hand, the entire ROTOPOD will fit into a much smaller volume. Of course, the present invention can be utilized in other areas besides traditional manufacturing and machine tool operations. It is usable in connection with any machine that requires that an operator be brought into contact with an object.

A ROTOPOD can be applied to a table system that holds specimens for microscope viewing. The sensitive optics of the microscope remain fixed in space as the specimen is moved by the ROTOPOD into focus along a Z-axis direction. The ROTOPOD can also move the specimen in an X-Y direction for viewing different specimen sections. A given specimen can additionally be tipped and tilted by the ROTOPOD for viewing of uneven specimen surfaces and further rotated for alignment purposes.

A ROTOPOD can also be utilized in the area of scanning tunneling microscopy and electron scanning microscopy because of its ability to function in a vacuum environment. Both scanning tunneling microscopy and electron scanning microscopy require a high vacuum where the object to be viewed must be guided very precisely with a minimum amount of dynamic and static vibration, a task which can be accomplished by a ROTOPOD.

A ROTOPOD can further be utilized in medical applications. In an operating room, a patient prepared for an operation can be moved in space to a location and position which is ergonomically optimal for a surgeon or other medical professionals to perform a given medical procedure. A ROTOPOD device can move a patient during a medical procedure to a position that accommodates and aids both the patient and the medical staff in comfort. Specifically, as the patient reaches a stage of recovery during a post operation period, a ROTOPOD device can move the patient to a location in space as best defined by the doctor or medical personnel in order, for example, to drain fluids or allow for a better flow of blood to specific body parts. Other medical applications of the ROTOPOD include any human services areas which require patients to be seated in a chair or laid onto a flat surface. With a ROTOPOD device incorporated into a dental chair, a dentist will have easier access to the patient while providing greater comfort to the patient by adjusting the ROTOPOD via its six degree range of motion. The ROTOPOD is ideal for chiropractic, optometrical, and massage therapeutic applications to name a few.

Another application of a ROTOPOD is its ability to aim and guide a telescope for celestial observations. A ROTOPOD can lift a telescope from its shielded environment (e.g. a building with a removable roof section) into an observation position. In this position, with closely extended angle connectors, the ROTOPOD inherently performs at a high level of resolution, accuracy, and vertical stiffness. During non-operating hours, the ROTOPOD can bring the telescope toward a resting home position, allowing for the upper platform to rest on top of the lower platform for cleaning and maintenance activities.

A ROTOPOD can also be used as a six-degree-of-freedom joystick. In this application, the motor of each angle connector can be replaced by a signal feedback device (e.g. an electrical potentiometer). By holding a handle attached to the center of the upper surface of the upper platform, the human hand can guide the six-degree-of-freedom joystick through space. The outputs of the feedback devices can provide inputs for a six-degree-of-freedom motorized ROTOPOD acting as a slave. Thus, remote human control of a ROTOPOD or other multi-axes mechanism allows for an abundance of applications in different environments (e.g. explosive, radio active, outer space, remote handling, 3-D video games, etc.).

Other variations and modifications of the present invention will be apparent to those of ordinary skill in the art, and it is the intent of the appended claims that such variations and modifications be covered. For example, the pivots can be removed from the upper platform or the lower platform to provide independent motion for the ROTOPOD. In essence, the pivots can be utilized as the "feet" of a moveable ROTOPOD embodiment. In addition, the nodes may be on the edge of the platforms rather than the surface. Furthermore, while the length of the leg assemblies is not adjustable, embodiments with different length leg assemblies, or with different lengths of upper and lower rods, may provide for desired workspaces in certain instances. It is intended that the scope of the present invention be defined by the claims appended hereto.

I claim:

1. A multi-axes positioning apparatus comprising:
   upper and lower platforms, each platform having opposed upper and lower surfaces, the lower surface of said upper platform being generally aligned with and spaced from the upper surface of said lower platform;
   six independent leg assemblies extending between said platforms; each leg assembly consisting of:
      a fixed-length upper rod having top ends, one end being moveably connected to said upper platform;
      a fixed-length lower rod having two ends, one end being moveably connected to said lower platform;
      angle connector means for connecting the other end of the upper rod to the other end of the lower rod, said angle connector means permitting said upper rod to move with respect to said lower rod with only one degree of freedom;
   each said platform having three nodes spaced in a triangular arrangement, wherein only two of said leg assemblies are connected adjacent each node on each platform; and no two leg assemblies are connected adjacent the same nodes on both platforms.

2. The apparatus of claim 1 wherein the length of all leg assemblies is equal.

3. The apparatus of claim 2 wherein the length of all upper rods is equal and the length of all lower rods is equal.

4. The apparatus of claim 3 wherein said lower rods are approximately 50% longer than said upper rods.

5. The apparatus of claim 1 wherein said leg assemblies are connected to said lower platform according to the following arrangement:
   first and second leg assemblies to the first node, third and fourth leg assemblies to the second node, and fifth and sixth leg assemblies to the third node; and said leg assemblies are connect to said upper platform according to the following arrangement:
   first and sixth leg assemblies to the first node, second and third leg assemblies to the second node, and fourth and fifth leg assemblies to the third node.

6. The apparatus of claim 1 wherein the connection of each pair of leg assemblies to a platform at a node comprises:
   a pair of hemispheres pivotable with respect to each other only about an axis;
   socket means for holding said pair of hemispheres to said platform and permitting rotation of said hemispheres with respect to said platform within said socket means; and
   one leg assembly of the pair of leg assemblies being rigidly attached to each hemisphere.

7. The apparatus of claim 1 wherein the connection of each leg assembly to a platform comprises a ball and socket assembly, said leg being rigidly fastened to said ball, said socket being fastened to said platform.

8. The apparatus of claim 7 wherein said platform is said upper platform.

9. The apparatus of claim 1 wherein said angle connection comprises:
   a straight rigid member extending along an axis of rotation perpendicular to a plane containing said upper and lower rods;
   a first bracket rigidly attached to said rigid member for rotation therewith, one of said rods being rigidly attached to said first bracket;
   a second bracket slidably attached for rotation about said rigid member, the other of said rods being rigidly attached to said second bracket; and
   means for preventing said second bracket from sliding along said axis relative to said first bracket.

10. The apparatus of claim 9 wherein each of said brackets has a pair of spaced first portions extending from said rigid member and a second portion connecting said spaced portions a distance from said rigid member, each of said rods being connect to one of said second portions.

11. The apparatus of claim 10 wherein said angle connector further comprises a second axis of rotation carried by said second bracket; first engaging means for movement with said first bracket; and second engaging means for rotation along said second axis, said first and second engaging means being mechanically engaged whereby movement of one engaging means causes movement of the other engaging means without slippage.

12. The apparatus of claim 11 wherein said first engaging means consists of a toothed gear and said second engaging means consists of a worm gear.

13. The apparatus of claim 12 wherein said angle connector further comprises a shaft encoder affixed to said second bracket for counting the revolutions of said worm gear to determine the angle between said rods.

14. The apparatus of claim 13 wherein said angle connector further comprises a drive motor affixed to said second bracket for driving said worm gear to adjust the angle between said rods.

15. The apparatus of claim 1 wherein each of said legs is connected to a platform by a universal drive comprising:

drive motor means for driving a drive axle;

a clevis having a pair of spaced arms attached adjacent an end of said drive axle for pivoting around an axis extending perpendicular to said drive axle; said leg being rigidly connected to said clevis; whereby rotation of said drive axle causes the position of said leg to be adjusted.

16. The apparatus of claim 15 wherein each pair of universal drives at a node is arranged with the drive axles extending in opposite directions but parallel to an edge of said platform.

17. The apparatus of claim 1 wherein said nodes are arranged in an equilateral triangle on each platform.

18. The apparatus of claim 17 wherein the angle between two lines extending from a connection of each leg assembly at a node to a center point of said platform is from 10° to 30°.

* * * * *